(12) United States Patent
Shyr

(10) Patent No.: US 6,354,547 B1
(45) Date of Patent: Mar. 12, 2002

(54) ATTACHMENT DEVICE

(75) Inventor: Daniel Shyr, Taipei (TW)

(73) Assignee: Avance Technologies, Inc., Taipei (TW)

( * ) Notice: Subject to any disclaimer, the term of this patent is extended or adjusted under 35 U.S.C. 154(b) by 0 days.

(21) Appl. No.: 09/543,261

(22) Filed: Apr. 5, 2000

(51) Int. Cl.⁷ .................................................. H05K 7/14
(52) U.S. Cl. ................ 248/221.11; 361/801; 312/265.6
(58) Field of Search ....................... 248/222.11, 221.11; 361/683, 759, 801; 312/265.6

(56) References Cited

U.S. PATENT DOCUMENTS 5,748,453 A  *  5/1998  Carney
6,215,685 B1 *  4/2001  Hass

* cited by examiner

*Primary Examiner*—Alvin Chin-Shue
(74) *Attorney, Agent, or Firm*—Pro-Techtor International Services

(57) ABSTRACT

An attachment device for attaching an expansion card having metal bracket to computer's back panel is disclosed. The device comprises a body having one side secured to the computer's back panel and a plurality of sliding members slidable in the body wherein after the expansion card has engaged with the computer's back panel by the body, each of the sliding members may slide from a first position in the body to a second position for quickly securing the expansion card to the computer' back panel.

2 Claims, 3 Drawing Sheets

ATTACHMENT DEVICE

FIELD OF THE INVENTION

The present invention relates to attachment devices and more particularly to an attachment device to attach an expansion card or circuit board to computer's back panel while having the feature of quick in mounting and detachment.

BACKGROUND OF THE INVENTION

Low price and/or do-it-yourself (DIY) computers have been popular in recent years. Thus, to design improved attachment devices in order to quickly conveniently assemble computer components is a trend among component suppliers.

A conventional technique of attaching an expansion card 3 to computer's back panel 2 is shown in FIG. 1 wherein expansion card 3 has a metal bracket 31 being 90 degrees bent in one end to conform to computer's back panel 2 and a dent 32 corresponding to a threaded hole 22. In assembly, engage expansion card 3 with slot 23 on computer's back panel 2. Then employ a screw 5 to thread through dent 32 to secure to threaded hole 22 for achieving the purpose of securing expansion card 3 to computer's back panel 2.

But this is unsatisfactory for the purpose for which the present invention is concerned for the following reasons:
1. It needs a tool (e.g., screwdriver) to turn screw 5 in order to secure expansion card 3 to computer's back panel 2. Thus an additional assembly time is required.
2. It may bring inconvenience to user if such screw is not on hand during assembly or disassembly.

Thus, it is desirable to provide an improved attachment device in order to overcome the above drawbacks of prior art.

SUMMARY OF THE INVENTION

It is therefore an object of the present invention to provide an attachment device to attach a circuit board to computer's back panel without employing a screw while having the feature of quick in mounting and detachment.

It is another object of the present invention to provide an attachment device to attach a circuit board to computer's back panel which is well grounded for ensuring the circuit board to have a stable signal transmission capability, better quality, and a prolonged life cycle.

To achieve the above and other objects, in one aspect of the present invention provides an attachment device comprises a body having one side secured to the computer's back panel and a plurality of sliding members slidable in the body wherein after the circuit board has engaged with the computer's back panel by the body, the sliding member may slide from a first position in the body to a second position for securing the circuit board to the computer' back panel.

A second aspect of the invention comprises a first elongate slit and a second elongate slit provided in the distal and proximate positions of the side surface of the body with respect to computer's back panel, an elongate projection protruded on the sliding member corresponding to the side surface of the body such that with the cooperation of the projection and the slits, the sliding member may secure on the support plate of the body when sliding to the first and second positions, and an engagement member of the sliding member protruded from one side proximate the computer's back panel such that the engagement member may tightly urge against the expansion card when the projection of the sliding member is engaged with the second slit.

Preferably, a rail is provided on the top of one support plate, while the other opposing rail is provided on the bottom of an adjacent support plate. The sliding member has two opposing guide grooves each corresponding to the rail such that the sliding member may slide in the body.

The above and other objects, features and advantages of the present invention will become apparent from the following detailed description taken with the accompanying drawings.

DETAILED DESCRIPTION OF PREFERRED EMBODIMENTS

Figure 1:
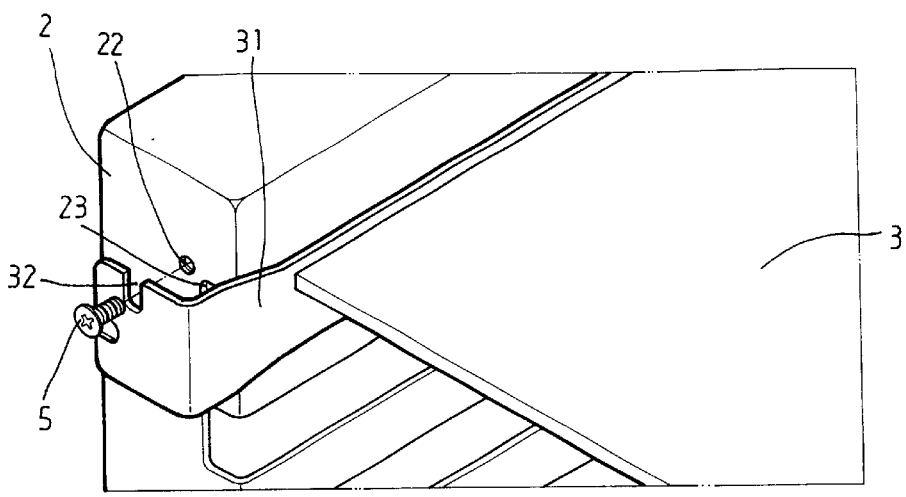
FIG. 1 is a perspective view showing mounting an expansion card to computer's back panel by means of a prior art attachment device.
Figure 2:
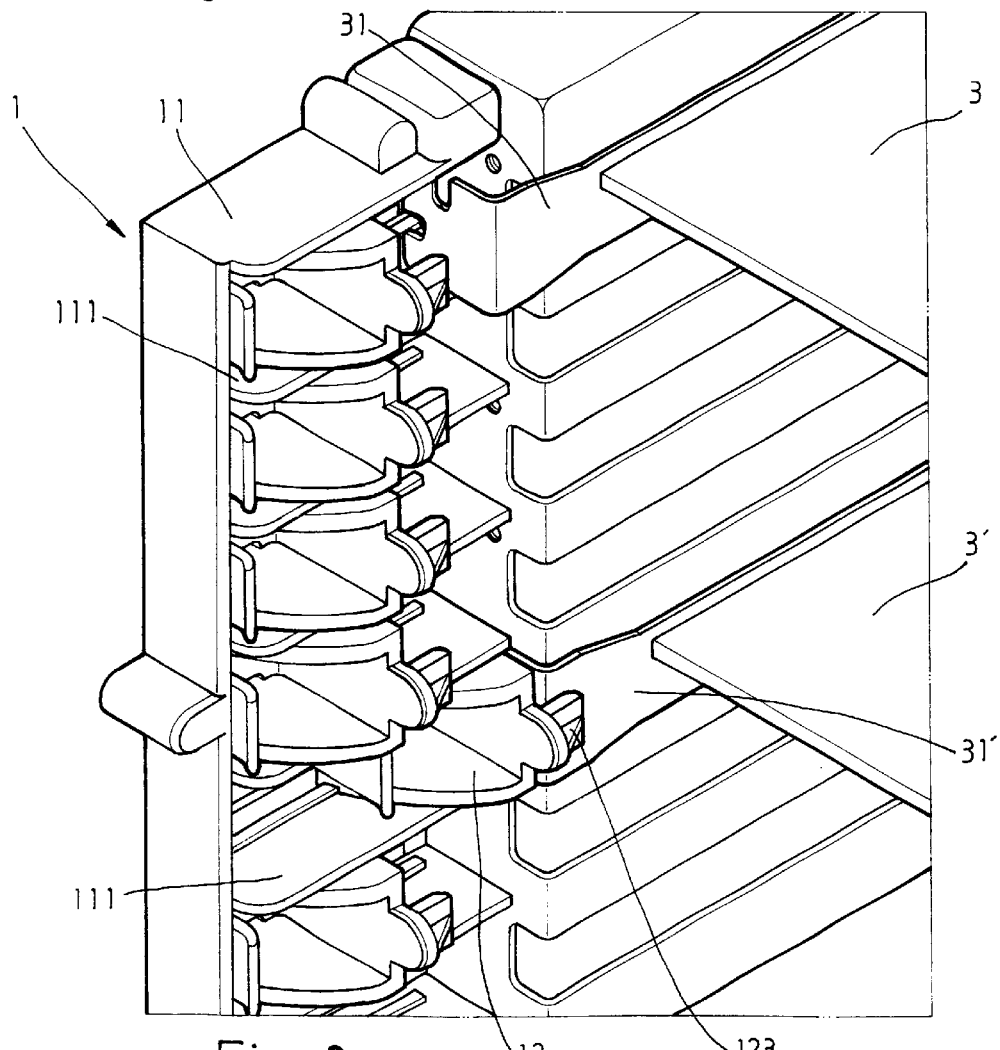
FIG. 2 is a perspective view showing mounting an expansion card to computer's back panel by means of attachment device of the invention.
Figure 3:
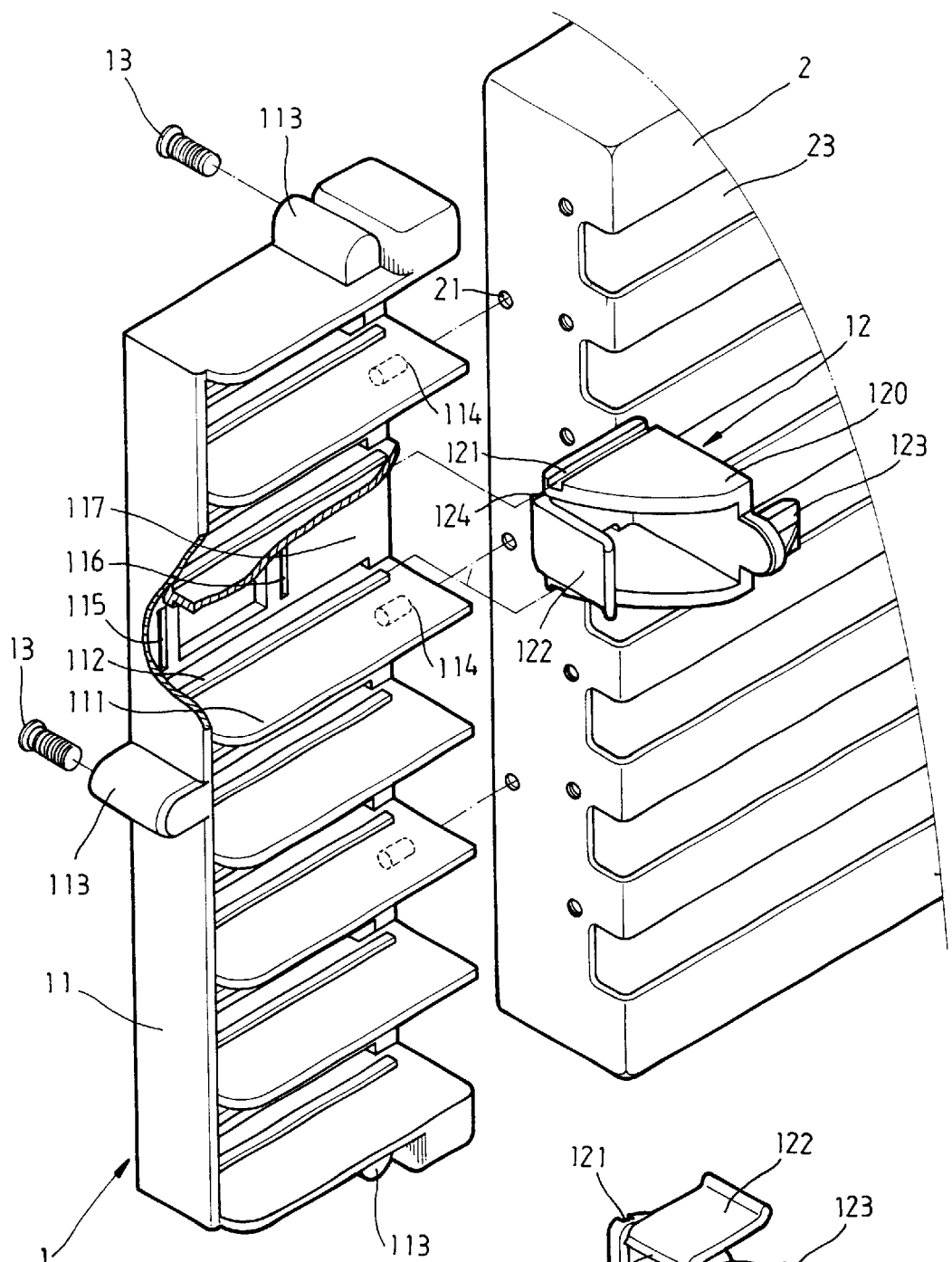
FIG. 3 is an exploded perspective view of FIG. 2.
Figure 3A:
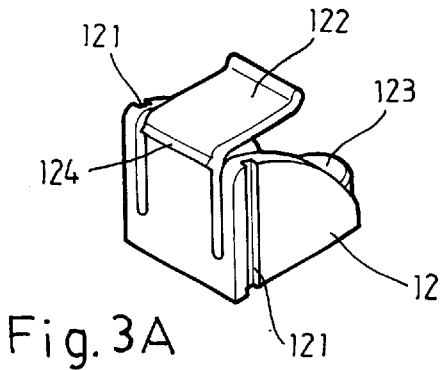
FIG. 3A is another perspective view showing the sliding member of FIG. 3 in a different angle.

Referring to FIGS. 2 and 3, there is shown an attachment device 1 constructed in accordance with the present invention. As shown, attachment device 1 is employed to secure metal bracket 31 of expansion card 3 to slot 23 of computer's back panel 2. The attachment device 1 comprises a body 11 and a plurality of sliding members 12 wherein body 11 has a plurality of horizontal parallel support plates 111 each corresponding to a slot 23 of the computer's back panel 2 and a plurality of space 110 each provided on the support plate 111 for receiving sliding member 12. A rail 112 is provided on the top of one support plate 111, while the other opposing rail 112 is provided on the bottom of an adjacent support plate 111. The sliding member 12 has two opposing guide groove 121 each corresponding to a rail 112 such that sliding member 12 may slide in body 11. A side surface 117 is defined between two adjacent support plates 111. A first elongate slit 115 and a second elongate slit 116 are provided in the distal and proximate positions of the side surface 117 with respect to computer's back panel 2.

The sliding member 12 has an engagement member 123 protruded from one side proximate the computer's back panel 2 and an elongate projection 124 protruded on the surface of body 11 corresponding to the side surface 117. The sliding member 12 may position in a first position on the support plate 111 when elongate projection 124 is engaged with slit 115 and position in a second position on the support plate 111 when elongate projection 124 is engaged with slit 116. Also, sliding member 12 has an integrally formed flexible latched member 122 extended from the elongate projection 124. Such that when latched member 122 is pressed elongate projection 124 may disengage from slit 115 or 116 which in turn causes sliding member 12 to become slidable along the guide grooves 121 between two adjacent support plates 111.

Additionally, a pin 114 is provided on the bottom of support plate 111 proximate the computer's back panel 2. A plurality of holes 21 each corresponding to the pin 114 are provided on wall adjacent to the slots 23. As such, body 11 may secure to the wall of the computer's back panel 2 when pins 114 are engaged with holes 21. A plurality of internal screw thread portions 113 (three are shown) are protruded on the outer surface of body 11.

Figure 4:
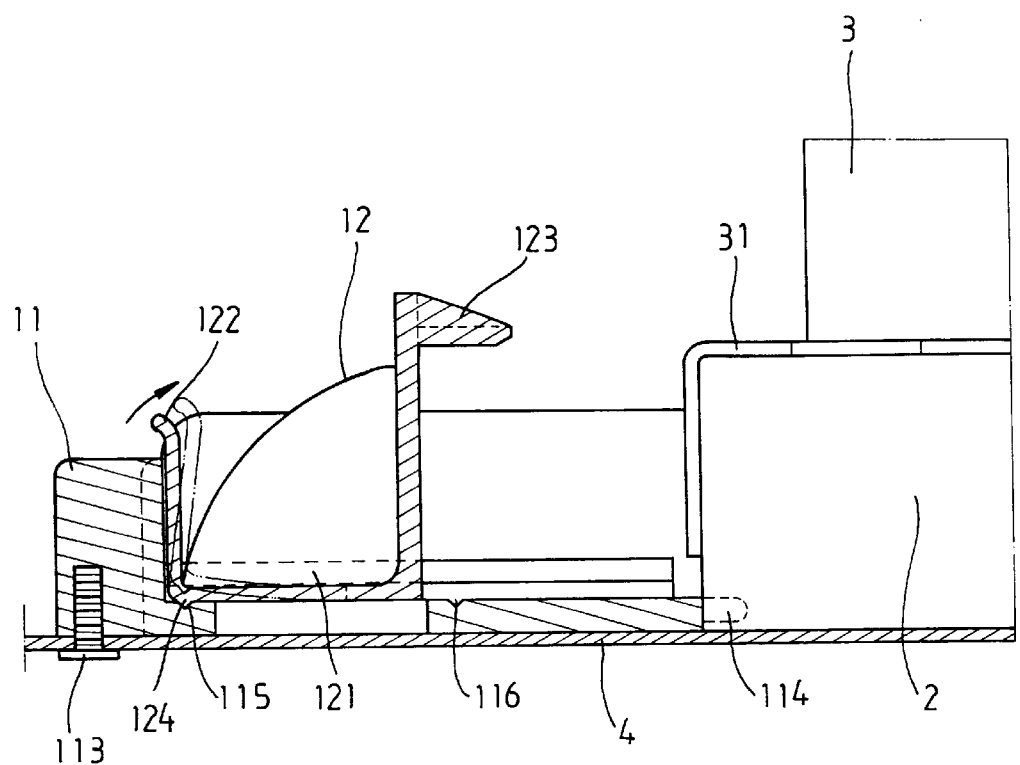
FIG. 4 is a sectional view showing the position of sliding member of FIG. 2 prior to mounting.
Figure 5:
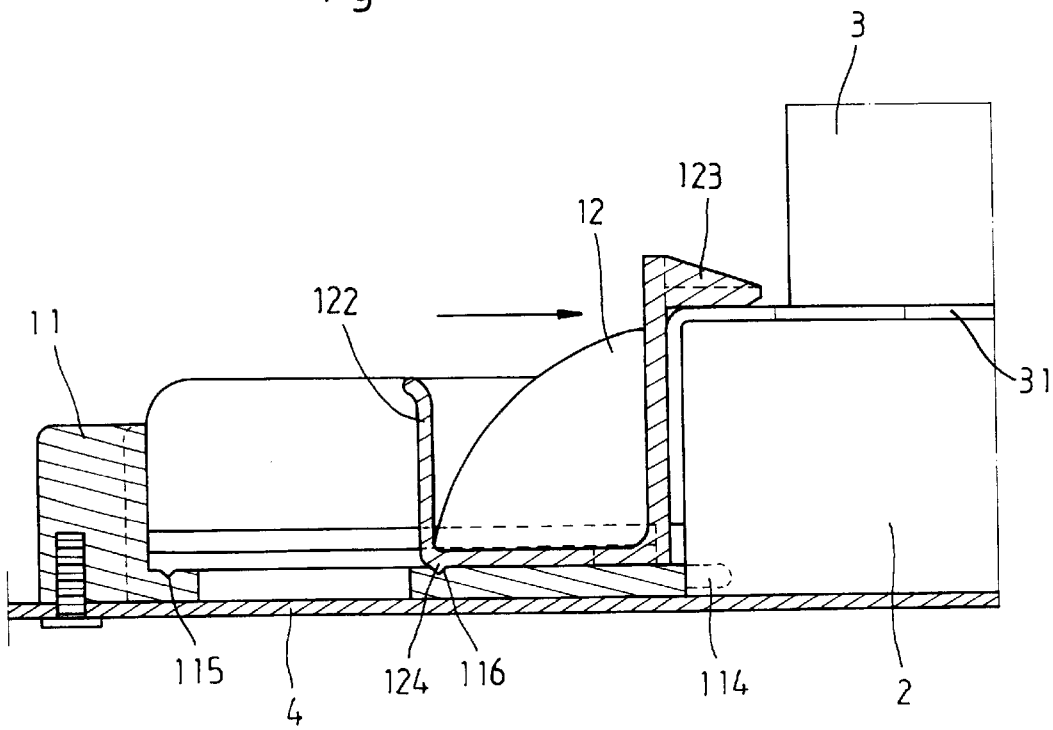
FIG. 5 is similar to FIG. 4, the sliding member being mounted.

Referring to FIGS. 4 and 5, in assembly, first thread screws 13 through computer case 4 and internal screw thread portions 113 to secure body 11 to computer case 4. Then place the about 90 degrees bent portion of metal bracket 31 of expansion card 3 in the space 110 between two adjacent support plates 111 of body 11. This completes an initial positioning. Now elongate projection 124 of sliding member 12 is engaged with the first slit 115 in the first position. Then press latched member 122 of sliding member 12 to disengage elongate projection 124 from first slit 115. Slide sliding member 12 toward slot 73 of computer's back panel 2 until elongate projection 124 of sliding member 12 is engaged with the second slit 116 in the second position. As a result, surfaces 120 and engagement member 123 of sliding member 12 may tightly urge against the bent portion and straight portion of metal bracket 31 of expansion card 3 respectively.

In disassembly, simply press latched member 122 of sliding member 12 to disengage elongate projection 124 from second slit 116. Then slide sliding member 12 away from slot 23 of computer's back panel 2 until elongate projection 124 of sliding member 12 is engaged with the first slit 115 in the first position. As a result, expansion card 3 may detach from slot 23 of computer's back panel 2 (not further shown).

While the invention herein disclosed has been described by means of specific embodiments, numerous modifications and variations could be made thereto by those skilled in the art without departing from the scope of the invention set forth in the claims.

What is claimed is:

1. An attachment device for attaching an expansion card having a metal bracket to a back panel of a computer, said device comprising:

a body having a side secured to said back panel, there being a plurality of sliding members slidable in said body such that after said expansion card has been engaged with said back panel by said body, each of said sliding members may slide from a first position in said body to a second position in said body to secure said expansion card to said back panel, a plurality of support plates in said body, a space being formed between each pair of adjacent ones of said support plates, said spaces each receiving one of said sliding members, a rail being provided on each of a top side and a bottom side of each of said support plates, each of said sliding members having a pair of opposing guide grooves, each of said guide grooves engaging one of said rails such that each of said sliding members slides on said rails, an engagement member protruding from a first side of each of said sliding members, said engagement member is positioned proximate said back panel such that said engagement member secures said metal bracket of said expansion card to said body when said sliding member slides from said first position to said second position; wherein each of said sliding members comprises a projecting member, and said body comprises a first elongated slot and a second elongated slot for each said projecting member, said projecting member being received in said first elongated slot when said sliding member is in said first position, and said projecting, member is received in said second elongated slot when said sliding member is in said second position, and each of said sliding members further comprises an integrally formed flexible latching member extending from a second side of each of said sliding members, said latching member causing said projecting member to disengage from said elongated slots when said latching member is pressed, thereby allowing said sliding member to be slidable in said space, and wherein each of said support plates comprises a bottom pin proximate said back panel, said back panel comprising a plurality of slots to receive said bottom pins such that said body is secured to a wall of said back panel when said pins are engaged with said holes.

2. The attachment device of claim 1, wherein:

said body comprises a plurality of threaded screw receiving recesses that enable a user to pass at least one screw through a case of said computer, said at least one screw being received in one of said threaded recesses so as to secure said body to said case of said computer.

* * * * *